United States Patent [19]
Crouch et al.

[11] 3,974,445
[45] Aug. 10, 1976

[54] PORTABLE KILOVOLTMETER

[75] Inventors: Thomas J. Crouch, Leonard; Larry G. Hait, Roseville, both of Mich.

[73] Assignee: Merc-O-Tronic Instruments Corporation, Almont, Mich.

[22] Filed: Oct. 31, 1974

[21] Appl. No.: 519,426

[52] U.S. Cl. ............................ 324/123 R; 324/119; 324/126
[51] Int. Cl.² ...................... G01R 1/30; G01R 15/04
[58] Field of Search ............... 324/123 R, 72.5, 119, 324/103 P, 16 R, 133, 126

[56] References Cited
UNITED STATES PATENTS

| | | | |
|---|---|---|---|
| 2,255,502 | 9/1941 | Bousman | 324/103 P |
| 3,045,199 | 7/1962 | Shobert | 324/72.5 |
| 3,300,713 | 1/1967 | Fulton | 324/16 R |
| 3,617,881 | 11/1971 | McCormick | 324/123 R |
| 3,829,774 | 8/1974 | Cerveny | 324/133 |

*Primary Examiner*—R. V. Rolinec
*Assistant Examiner*—Ernest F. Karlsen
*Attorney, Agent, or Firm*—Harness, Dickey & Pierce

[57] ABSTRACT

A portable kilovoltmeter especially suited for measuring the secondary voltage of an ignition coil includes an operational amplifier whose input is connected via an input circuit to the ignition coil secondary winding and whose output is connected via an output circuit to a galvanometer on which the secondary voltage is read. The input circuit to the operational amplifier includes a probe which forms a portion of a capacitive voltage-dividing network via which the secondary voltage is reduced in amplitude before it is supplied to the operational amplifier input. The probe includes a capacitive probe element which makes contact with the hot terminal of the ignition coil secondary and a length of high-tension, high-resistance conductor which leads from the probe element to the console containing the galvanometer and the kilovoltmeter circuitry. The input circuit further includes filters and dropping resistors to filter and further drop the secondary voltage before it is supplied to the operational amplifier input. A switch means in the input circuit selects either positive or negative polarity portions of the secondary voltage for input to the kilovoltmeter. A switch means in the output circuit selectively connects the galvanometer with the operational amplifier output so that the galvanometer can indicate the magnitude of whichever polarity of secondary voltage is selected by the switch means in the input circuit.

10 Claims, 1 Drawing Figure

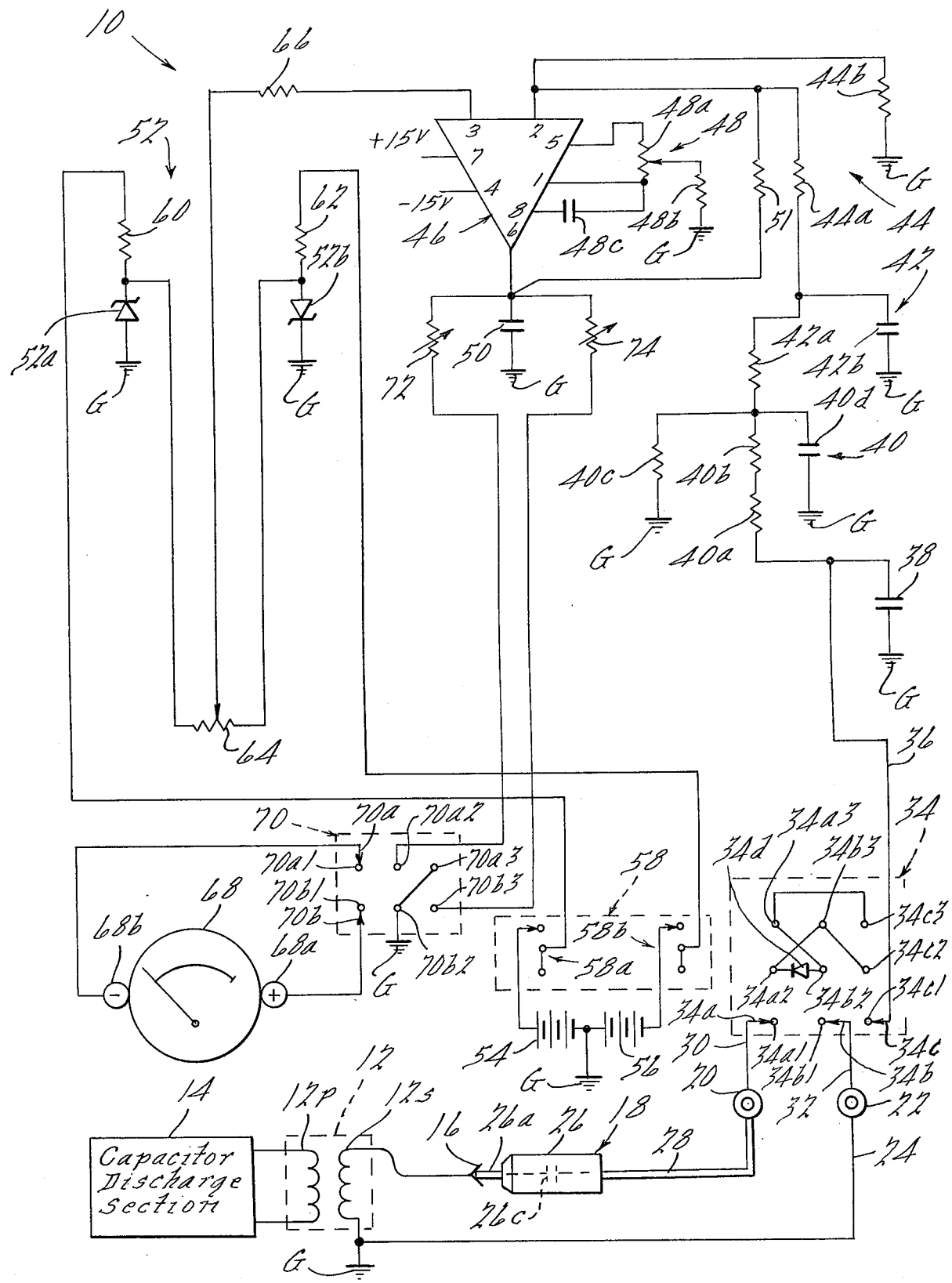

PORTABLE KILOVOLTMETER

BACKGROUND AND SUMMARY OF THE INVENTION

The present invention relates to electrical measuring equipment and, in particular, to a novel kilovoltmeter which is especially useful for measuring the kilovolt output of the secondary winding of an ignition coil.

The task of accurately measuring the kilovolt output of an ignition coil secondary winding is not an easy one. Presently available equipment for measuring the kilovolt output of an ignition coil is often bulky, difficult to transport, relatively complicated, hard to set up and adjust, and may not be universally suited for the various possible types of ignition coils and systems currently in use. Further, the accuracy of such equipment may be less than optimum where the secondary voltage is characterized by a very fast rise time, as in a capacitor-discharge ignition system. The present invention is directed to providing a novel kilovoltmeter which is generally less complicated than prior kilovoltmeters yet which is capable of providing an accurate measurement of ignition coil secondary voltage, and without complicated setup procedures. Furthermore, the invention provides a compact kilovoltmeter which is conveniently transportable and which can be readily connected and set up with an ignition coil whose secondary voltage is to be measured. The invention may be used with virtually all ignition systems and coil types and is especially good for accurately measuring the secondry voltage of a capacitor-discharge system which is characterized by a very fast rise time. Moreover, this measurement can be made regardless of the polarity of the secondary voltage rise, or the specific shape of the secondary voltage waveform. Further, the invention permits separate measurements of the positive and negative polarity portions of the unloaded secondary voltage waveform with only a single galvanometer being used to provide a reading of both measurements.

A kilovoltmeter according to the present invention comprises an electronic circuit which is coupled with an ignition coil secondary and which drives a galvanometer in accordance with the secondary voltage to provide a reading of the secondary voltage magnitude. One feature includes an operational amplifier which amplifies an input signal representative of the ignition coil secondary voltage to provide an output signal to the galvanometer. Another feature of the invention resides in a novel input circuit which is used to connect the secondary of the ignition coil with the input of the operational amplifier. This input circuit includes a probe assembly which plugs into a console containing the kilovoltmeter circuitry. This probe assembly includes a capacitive probe element used to make contact with the hot terminal of the secondary winding and a length of high-tension, high-resistance conductor which leads from the probe element to the console. The probe element and conductor connect in series with each other and between the secondary and the operational amplifier. The kilovoltmeter circuitry also has a capacitor operatively connected with the probe assembly to cooperate with the capacitive probe element and the high-resistance conductor to provide a voltage-dividing circuit which supplies to the operational amplifier a voltage-divided signal representative of the actual secondary output voltage, but appreciably attenuated. This voltage-divided signal is passed through additional filter and attenuating stages to develop the input signal which is applied to the input of the operational amplifier. The input circuit also has a switch means to select either positive or negative polarity portions of the secondary output for waveform measurement. A novel zeroing adjustment is also provided to zero the galvanometer needle, and this is derived as a selectable reference voltage from a reference circuit supplied as a reference input to the operational amplifier. A further feature resides in the output circuit which connects between the output of the operational amplifier and the galvanometer. The output circuit includes a switch means which permits both positive and negative output signals of the amplifier, which are representative of negative and positive secondary voltage, to be measured by the galvanometer even though the galvanometer itself is operable from only one polarity signal. Included in the output circuit are two calibrating resistors, each of which calibrates the output of one polarity of the amplifier output signal.

Additional features and advantages of the invention, along with those already enumerated, will be seen in the ensuing description and claims which are to be takin in conjunction with the accompanying drawing.

BRIEF DESCRIPTION OF THE DRAWING

The drawing illustrates a preferred embodiment of the invention in accordance with the best mode presently contemplated for carrying out the invention. The drawing illustrates an electrical schematic diagram of a kilovoltmeter in accordance with principles of the invention measuring the output of an ignition coil secondary winding.

DESCRIPTION OF THE PREFERRED EMBODIMENT

In the drawing a kilovoltmeter 10 according to the present invention is shown in use measuring the secondary voltage of an ignition coil 12. Ignition coil 12 is a part of a conventional ignition system which, by way of example, may include a capacitor-discharge ignition section 14. Ignition coil 12 comprises a primary winding 12p which is connected with the capacitor-discharge section 14 and a secondary winding 12s which is magnetically coupled with primary winding 12p. When the capacitor-discharge ignition section 14 fires, a charged capacitor is discharged into primary winding 12p and ignition coil 12 in turn generates a large secondary voltage output across secondary winding 12s. This secondary voltage is supplied to a spark plug to ignite the air-fuel mixture in an engine cylinder with which the spark plug is associated. Typically, the secondary winding 12s has one terminal connected to ground G; for example, via the coil mounting on adjacent structure such as the engine cylinder block. The other terminal of the secondary winding is therefore the "hot" terminal which terminates in a connector plug 16 via which the secondary voltage is distributed to the spark plug (or plugs) in the ignition secondary system. In general, the secondary voltage developed across secondary 12s in response to the firing of the capacitor-discharge ignition system 14 rises very rapidly. When its magnitude reaches a level sufficient to fire the spark plug to which it is coupled, the voltage drops very rapidly. With the ignition coil operating in the system, it is generally inconvenient, as well as somewhat difficult, to accurately gauge the performance of the ignition coil and capacitor-discharge section. Hence, it is desirable to measure the secondary voltage with the coil unloaded, that is, with the coil secondary disconnected from the secondary distribution system. With the coil unloaded, the secondary voltage appears as an oscillating waveform with a certain amount of damping due to loss in the system. Hence, the unloaded coil secondary voltage waveform typically includes successive half cycles of opposite polarity. The kilovoltmeter according to the present invention can accurately measure this output waveform regardless of the order of the polarities or the particular wave shape. Under test conditions, the only loading on the secondary is that occasioned by the kilovoltmeter, and with the present invention this loading has no significant effect on the secondary voltage waveform. Thus, with the present invention, a reliable accurate measurement can be obtained. With the present invention, the secondary voltage output of the ignition coil is more closely and accurately coupled into the kilovoltmeter to provide an improved and more accurate measurement of the secondary voltage. This is especially significant in a capacitor-discharge ignition system wherein the secondary voltage is characterized by larger amplitudes and faster rise times than in other types of ignition systems. Further, with the present invention, it has been found that the performance of an ignition coil, as measured by its secondary voltage, can be ascertained by separately measuring the positive and negative portions of the "no-load" secondary voltage. Accordingly, with the present invention, one polarity of the secondary voltage waveform is monitored in one setting of the kilovoltmeter and the opposite polarity is monitored in another setting. Importantly, with the present invention, both positive and negative polarity voltages can be analyzed without the necessity of having a special or unique meter for each polarity system since the invention uses a single galvanometer to provide measurements of both positive and negative polarity voltages.

The input to kilovoltmeter 10 from ignition coil secondary 12s is supplied via a probe assembly 18 which connects into a jack plug 20 on the console which contains the kilovoltmeter circuitry and galvanometer. A ground connection from the ignition coil ground G to a second jack plug 22 is provided by a ground conductor 24. The probe assembly 18 constitutes one feature of the present invention and includes a probe element 26 having a tip 26a which contacts terminal 16 of secondary winding 12s. Probe element 26 is electrically equivalent to a capacitance as indicated schematically at 26c. Probe 18 further includes a length of high-tension, high-resistance conductor 28 which leads from probe element 26 to jack plug 20. By way of example, probe element 26 may be a high-voltage probe such as that commercially available from Delta Products, Grand Junction, Colo. Conductor 28 is preferably conventional ignition system secondary cable; for example, carbon conductor radio suppression hypalon covered cable (RTVS wire). Such cable has a resistance on the order of 40,000 ohms per foot, and it is contemplated that a 4- or 5-foot length of the cable is suitable in most instances. Thus, probe 18 electrically comprises the series combination of a capacitor and a resistor through which the secondary voltage is supplied to the kilovoltmeter circuitry.

Jack plugs 20 and 22, in turn, connect via leads 30 and 32 respectively to a selector switch means 34 which, in turn, connects via a lead 36 to the kilovoltmeter electronic circuitry contained within the kilovoltmeter console. Basically, switch means 34 operates to select either positive polarity or negative polarity half cycles of the secondary voltage for input to the kilovoltmeter circuitry, and does this as follows. Leads 30, 32, and 36 are respectively connected to movable contacts 34a, 34b, 34c, respectively, of switch means 34. Each movable contact is selectively operable to one of three sets of fixed contacts: movable contact 34a being selectively operable to fixed contacts 34a1, 34a2, 34a3; movable contact 34b to fixed contacts 34b1, 34b2, 34b3; and movable contact 34c to fixed contacts 34c1, 34c2, 34c3. The movable contacts 34a, 34b, and 34c are ganged for operation in unison; hence, in the "off" position contact 34a engages contact 34a1, contact 34 b engages contact 34b1, and contact 34c engages contact 34c1. In the "positive polarity select" position, contact 34a engages contact 34a2, contact 34b engages contact 34b2, and contact 34c engages contact 34c2. In the "negative polarity select" position, contact 34a engages contact 34a3, contact 34b engages contact 34b3, and contact 34c engages contact 34c3. Switch means 34 includes a diode 34d having its anode connected to contacts 34b2, 34a3, and 34c3 and its cathode connected to contacts 34a2, 34b3, and 34c2. Hence, when switch means 34 is in the positive polarity select position, the system ground G connects to the anode of diode 34d and, therefore, those portions of the secondary voltage wherein the voltage at secondary terminal 16 is positive with respect to ground G will be supplied through switch means 34 to conductor 36, while those portions which are of negative polarity will be shorted through diode 34d. Hence, in the positive polarity select position of switch means 34, only positive polarity portions of the secondary voltage waveform appear at conductor 36. When switch means 34 is in the negative polarity select position, the system ground G connects to the cathode of diode 34d so that, when the voltage waveform at secondary terminal 16 is negative with respect to ground G, it is transmitted by switch means 34 to conductor 36, while positive portions of the waveform are short-circuited through diode 34d. Hence, in the negative polarity select position of switch means 34, only negative polarity portions of the secondary voltage waveform appear at conductor 36.

The electronic circuitry of the kilovoltmeter further includes a capacitor 38 which connects between conductor 36 and ground G. In accordance with a further feature of the invention, probe assembly 18 and capacitor 38 define a capacitive voltage-dividing and attenuating network connected across secondary winding 12s. The voltage appearing at conductor 36 is significantly reduced in amplitude from the secondary voltage at secondary output terminal 16. However, this feature of the invention, while reducing the secondary voltage in amplitude for a level compatible with the hereinafter described electronic components in the system, provides excellent coupling which minimizes loading and distortion to thus enhance the accuracy of the measurement. This is especially significant in view of the fast rise time of the secondary voltage in capacitor-discharge ignition systems, as commented upon above. By way of example, the voltage appearing at conductor 36 may be on the order of seventy to eighty volts.

The kilovoltmeter circuitry includes additional stages through which the signal at conductor 36 is passed. A first filter stage 40 comprising resistors 40a, 40b, 40c, and a capacitor 40d connected as illustrated filters undesired noise from the signal at conductor 36 and supplies a filtered and attenuated signal to a second filter stage 42. Stage 42 comprises a resistor 42a and a capacitor 42b, connected as illustrated to provide additional filtering and attenuation. A resistive voltage-dividing stage 44 comprising resistors 44a and 44b connects across the output of filter 42, and the junction of resistors 44a and 44b connects to an input terminal of an operational amplifier circuit 46. Hence, stages 40, 42, and 44 serve to filter and to attenuate the signal at conductor 36 even further so that the signal supplied to amplifier 46 is of a suitable form for the amplifier. Importantly, however, the input circuitry of the invention provides to amplifier 46 a signal which accurately reflects the actual secondary voltage, thereby providing accuracy in the measurement obtained from the kilovoltmeter.

Amplifier circuit 46 may be a commercially available integrated circuit; for example, Texas Instruments types SN 52770 or SN 72770 are suitable. The various terminal designations 1 through 8 of amplifier 46 as shown in the drawing correspond to the manufacturer's terminal designations for their specific models. Suitable power from a power supply (not shown) is supplied to terminals 7 and 4 as indicated. A nulling circuit 48 comprising a potentiometer 48a, a resistor 48b, and a capacitor 48c is connected with terminals 8, 1, and 5 to null out the offset voltage of the amplifier. Terminal 2 is the inverting input terminal and terminal 3 the noninverting input terminal. Terminal 6 is the output terminal. A capacitor 50 connects across the output of amplifier 46 between terminal 6 and ground. A feedback resistor 51 connects the output of the amplifier back to the input by connecting terminal 6 to terminal 2.

A selectable reference voltage is supplied to terminal 3, and, as will be seen in greater detail later, this reference voltage is used to zero the needle of the galvanometer. A reference circuit 42 for providing this reference voltage comprises a pair of zener diodes 52a, 52b. Zener diode 52a has its anode connected to ground G, while zener diode 52b has its cathode connected to ground G. Each zener diode is biased to its zener region from a corresponding power supply; for example, a pair of batteries 54 and 56. However, an "on-off" switch 58 is used to couple the batteries to the zener diodes. Battery 54 has its negative terminal connected to ground G and its positive terminal connected through a set of contacts 58a of switch 58 and through a resistor 60 to the cathode of zener diode 52a. Battery 56 has its positive terminal connected to ground G and its negative terminal connected through a set of contacts 58b of switch 58 and through a resistor 62 to the anode of zener diode 52b. A very accurate voltage differential is thereby developed between the cathode of zener diode 52a and the anode of zener diode 52b when switch 58 is in its on position. A potentiometer 64 is connected between the cathode of zener diode 52a, and the anode of zener diode 52b and the wiper of potentiometer 64 may be used to select a desired voltage within the range of voltages between the zener reference voltages developed at the cathode of zener diode 52a and the anode of zener diode 52b. This voltage is supplied through a resistor 66 to terminal 3 of amplifier 46.

Operational amplifier 46 operates as follows. When identical signals are supplied to terminal 2 and 3, the output signal at terminal 6 is a null value; for example, zero volts. As the signal at terminal 2 becomes increasingly positive relative to the signal at terminal 3, the output signal at terminal 6 becomes increasingly negative. As the signal at terminal 3 becomes increasingly positive relative to the signal at terminal 2, the output signal at terminal 6 becomes increasingly positive. Hence, it can be appreciated that operational amplifier 46 acts as a substantially linear inverting amplifier whereby, for a selected constant value of the reference signal at terminal 3, the signal developed at output terminal 6 is inversely proportional to the input signal at terminal 2.

The output signal of amplifier 46 is used to drive a galvanometer 68 which provides a readable measurement of the output signal developed by the amplifier and, hence, serves to indicate the magnitude of the secondary voltage developed by the ignition coil. In accordance with a further feature of the invention, a selector switch 70 is arranged to selectively connect galvanometer 68 to the output of amplifier 46 whereby the galvanometer can measure both positive and negative output signals of the amplifier and, hence, negative and positive excursions of the secondary voltage waveform of the ignition coil. It has further been found that improved results are obtained by providing a separate calibration resistor to couple the output of amplifier 46 with the galvanometer depending upon whether positive or negative polarity signals are to be measured. Hence, a calibration resistor 72 connects from terminal 6 of amplifier 46 to switch 70 and is present to accurately calibrate a galvanometer 68 when positive polarity secondary voltages are measured; and a calibrating resistor 74 is connected between terminal 6 of amplifer 46 and switch 70 and is present to accurately calibrate galvanometer 68 when negative polarity secondary voltages are to be measured. Switch 70 comprises a pair of movable contacts 70a, 70b which are selectively operable in unison to fixed contacts 70a1, 70a2, and 70a3 and to contacts 70b1, 70b2, and 70b3. Calibrating resistor 72 connects to contact 70a2, and calibrating resistor 74 connects to contact 70b3. Contacts 70b2 and 70a3 are connected to ground G. The positive terminal 68a of galvanometer 68 connects to movable contact 70b and the negative terminal 68b to movable contact 70a. When movable contacts 70a, 70b are operated to contacts 70a1, 70b1, respectively, galvanometer 68 is completely disconnected from the remainder of the circuit. However, when the movable contacts 70a, 70b are operated to contacts 70a2, 70b2, galvanometer 68 is coupled through calibrating resistor 72 across the output of amplifier 46 whereby the galvanometer can measure the positive polarity excursions of the secondary voltage by measuring the negative output signal of amplifier 46. This position of switch 70 is designated the positive polarity select position. When contacts 70a, 70b are respectively operated to contacts 70a3, 70b3, galvanometer 68 is coupled through calibrating resistor 74 across the output of amplifier 46 and, hence, the galvanometer can indicate negative polarity excursions of the secondary voltage by measuring the positive output signal of amplifier 46. This position of switch 70 is designated the negative polarity select position. Although switch means 34 and switch 70 are shown separately in the drawing, it may be desirable to gang the two switches for operation in unison whereby both may be simultaneously operated to: the off position (as shown in the drawing); the positive polarity select position; and the negative polarity select position. It will be noted that, when both switches are in the positive polarity select position, galvanometer 68 is correctly connected with the output of operational amplifier 46 to provide a reading of the positive polarity secondary voltage and that, when both switches are in the negative polarity select position, galvanometer 68 is correctly connected with the output of operational amplifier 46 to provide a reading of the negative polarity secondary voltage. Hence, the invention enables a conventional galvanometer, which has only a unidirectional current measuring capability, to measure both positive and negative portions of the secondry output voltage of the unloaded ignition coil.

In light of the foregoing description, the operation of the kilovoltmeter can now be fully explained. The kilovoltmeter is carried by the operator and set up with the ignition coil which is to be tested. Appropriate connections of probe assembly 18 and the ground conductor 24 are made with the output terminal of the ignition coil secondary being disconnected from its system and probe element 26 connected therewith by inserting tip 26a into contact with connector 16. Switch 58 is turned to the on position to energize the zener diodes 52a, 52b from the respective batteries 54, 56. Switches 34 and 70 are set to either the positive or negative polarity select position. The needle of galvanometer 68 is zeroed by adjusting potentiometer 64. The capacitor-discharge section 14 is now operated, and the reading of galvanometer 68 is noted. Switches 70 and 34 are next set to the other operative position, meter 68 is zeroed, and capacitor-discharge section 14 is once again operated. A reading is taken on galvanometer 68. The two readings may be compared with the manufacturer's specifications to determine if the system is in compliance. It will be noted that the kilovoltmeter is not susceptible to damage if probe assembly 18 and ground conductor 24 are reversely connected with the respective jack plugs, nor is it susceptible to damage if switches 34 and 70 are not in the same position simultaneously. Hence, it can be seen that the invention provides an especially useful kilovoltmeter exhibiting the advantages enumerated above.

While it will be apparent that the preferred embodiment of the invention disclosed is well calculated to fulfill the objects above stated, it will be appreciated that the invention is susceptible to modification, variation, and change without departing from the spirit thereof.

By way of example, a specific embodiment of the invention has the following component values:

| | |
|---|---|
| capacitor 38 | .02 microfarads |
| resistor 40a | 10 megohms |
| resistor 40b | 8 megohms |
| resistor 40c | 2 megohms |
| capacitor 40d | .0015 microfarads |
| resistor 42a | 1 megohm |
| capacitor 42b | .22 microfarads |
| resistor 44a | 1 megohm |
| resistor 44b | .68 megohms |
| operational amplifier 46 | Texas Inst. SN 52770 or SN 72770 |
| offset circuit 48 | per operational amplifier spec sheet |
| capacitor 50 | 200 picofarads |
| resistor 51 | 1 megohm |
| zener diodes 52a, 52b | 15 volt breakdown |
| resistor 60 | 2 kilohms |
| resistor 62 | 2 kilohms |
| potentiometer 64 | 6 kilohms |
| resistor 66 | 1 megohm |
| resistor 72 | 10 kilohms |
| resistor 74 | 10 kilohms |

What is claimed is:

1. Means for measuring the voltage output of an ignition coil having a primary winding and a secondary winding comprising: amplifying circuit means having an input and an output; input circuit means connectable between the secondary winding and the input of said amplifying circuit means; and output circuit means including an indicating means connected with the output of said amplifying circuit means; said input circuit means including a probe means comprising a capacitor means, a length of high tension resistive radio suppression cable connected in series with said probe means, an additional capacitor means operatively connected with said first-mentioned capacitor means in a voltage dividing circuit which divides the secondary voltage to the input of said amplifying circuit means, and switch means selectively operable to supply only a selected polarity of the secondary voltage of the ignition coil to the input of said amplifier means.

2. The invention defined in claim 1 wherein said input circuit means further includes at least one filtering and attenuating stage connected between said voltage dividing circuit and the input of said amplifying circuit means.

3. The invention defined in claim 1 wherein said amplifying means comprises an operational amplifier having first and second inputs, said input circuit means being operatively connected with one of said inputs of said operational amplifier and a reference circuit means connected to supply a reference signal to the other of said inputs of said operational amplifier.

4. The invention defined in claim 3 wherein said reference circuit means includes means for selecting a desired value of the reference signal supplied to said other input of said operational amplifier.

5. The invention defined in claim 3 wherein said reference circuit means comprises a pair of zener diodes operating in their zener regions with one zener diode supplying a zener reference voltge of one polarity and the other zener diode a zener reference voltage of opposite polarity, said reference signal being selected from a range of voltages between said two reference voltages.

6. The invention defined in claim 5 including a potentiometer means connected between said two zener diodes via which the reference signal is selected and supplied to said other input of said operational amplifier.

7. The invention defined in claim 1 wherein said indicating means comprises a galvanometer capable of measuring only one polarity of signal, said amplifying circuit means provides an output signal which can be of either positive or negative polarity, and said output circuit means includes a switch means for selectively connecting the galvanometer with the output of said amplifying circuit means such that the galvanometer can measure positive polarity output signals in one position of said switch means and negative polarity signals in the other position of said switch means.

8. The invention defined in claim 7 wherein said output circuit means includes a calibrating means connecting the output of said amplifying circuit means and said galvanometer when said switch means is in one position and another calibrating means connecting the output of said amplifying circuit means and said galvanometer when said switch means is in another position.

9. Means for measuring the voltage output of an ignition coil having a primary winding and a secondary winding comprising: a high speed operational amplifier having a signal input terminal, a reference input terminal, and an output terminal, said operational amplifier comprising means for providing at its output terminal a control signal indicative of the difference between a signal at its signal input terminal and a signal at its reference input terminal; input circuit means for connecting said signal input terminal with the secondary winding of the ignition coil, including probe means comprising a first capacitor means, second capacitor means operatively connected in a voltage-dividing circuit with said first capacitor means, a length of high tension resistance radio suppression cable connected in series with said probe means, and first switch means for selecting a desired polarity of the voltage appearing at said cable for application to the signal input terminal of said operational amplifier; a reference circuit means including means for selecting a desired value of reference signal for application to said reference terminal of said operational amplifier; and output circuit means including indicating means operatively connected with the output terminal of said operational amplifier and responsive to said control signal, first calibrating means connected to the output of said operational amplifier for calibrating one polarity of said control signal supplied to said indicator means, second calibrating means connected in parallel with said first calibrating means for calibrating the other polarity of said control signal supplied to said indicator means, and second switch means for selectively connecting said indicator means with either said first or second calibrating means such that said indicator means can measure said one polarity of said control signal in one position of said switch means and said other polarity of said control signal in the other position of said switch means.

10. The invention defined in claim 9 wherein said indicating means comprises a galvanometer.

* * * * *